United States Patent [19]
Jager et al.

[11] Patent Number: 5,532,651
[45] Date of Patent: Jul. 2, 1996

[54] TUNABLE VOLTAGE CONTROLLED OSCILLATOR HAVING MICROSTRIP RESONATOR WITH CUTS FOR BETTER TUNING

[75] Inventors: Rene I. Jager, North York; Peter Vizmuller, Richmond Hill; Mathias M. Gimpelj, Markham, all of Canada

[73] Assignee: Motorola, Inc., Schaumburg, Ill.

[21] Appl. No.: 417,557

[22] Filed: Apr. 6, 1995

[51] Int. Cl.⁶ .................. H03B 5/18; H01P 7/08
[52] U.S. Cl. ................ 331/96; 331/117 D; 331/107 SL; 331/177 V; 333/235; 455/124; 455/262; 455/264
[58] Field of Search ................. 331/36 C, 96, 331/99, 100, 117 D, 107 SL, 177 R, 177 V, 181, 187; 333/219, 235; 455/76, 124, 261, 262, 264

[56] References Cited

U.S. PATENT DOCUMENTS

| | | |
|---|---|---|
| Re. 31,470 | 12/1983 | Bedard et al. ............ 333/204 |
| 3,805,198 | 4/1974 | Gewartowski et al. ............ 333/219 X |
| 4,619,001 | 10/1986 | Kane ............ 333/235 X |
| 4,706,050 | 11/1987 | Andrews ............ 333/235 X |
| 4,749,963 | 6/1988 | Makimoto et al. ............ 333/220 X |
| 5,291,153 | 3/1994 | Shiga ............ 331/117 D X |
| 5,334,961 | 8/1994 | Shirai et al. ............ 333/219 X |

*Primary Examiner*—David Mis
*Attorney, Agent, or Firm*—M. Mansour Ghomeshi

[57] ABSTRACT

An oscillator (100) includes a resonator (218) having a mirco-strip (217). The micro-strip (217) couples an inductive component (221) to a capacitive portion (219). To tune the oscillator (100), a number of cuts are made on the pad (221) in order to restrict the signal flow. The width of these cuts determine the degree of restriction posed on the signal flow. This controllable restriction of the signal flow provides the circuit (100) with enhanced tunability.

12 Claims, 4 Drawing Sheets

5,532,651

TUNABLE VOLTAGE CONTROLLED OSCILLATOR HAVING MICROSTRIP RESONATOR WITH CUTS FOR BETTER TUNING

TECHNICAL FIELD

This invention is generally related to oscillators and more particularly to voltage controlled oscillators.

BACKGROUND

Oscillators are used in radio communication devices to provide a variety of functions such as the generation of a local oscillator signal. Resonators are used in oscillators as the means of generating a free running signal. Resonators are available in a variety of topologies. One style of resonators utilizes a micro-strip followed by an inductor. This particular resonator style is suitable for applications where tunability is desired. In general, variation in component tolerance and parasitic as well as variation over temperature requires that frequency of oscillators be adjusted in a post assembly process. From a performance stand point using a fixed tune method, capacitive or inductive is the most desirable. The trim range of an inductor micro-strip component is proportional to the effective length/width variation of the component caused by the adjustment process. This tuning range is constrained by the physical size of the component, the parasitic capacitance, and the degradation of Q factor caused by narrowing the line when tuning.

Current methods of inductive tuning use a single cut into a metalized area. The tuning area required for this approach would make it necessary to increase the size of the tuning element. This increased size has two problems. First, the thermal stress on the alumina to FR4 solder connections would cause solder cracking and a consequent reduction in the mean time before failure (MTBF) for the product. Second, the decrease in the characteristic impedance of the line would reduce the varactor tuning range for a given circuit.

These problems combined with others render this tuning style undesirable. An improved method of tuning resonators is therefore desired.

DETAILED DESCRIPTION OF THE PREFERRED EMBODIMENT

Figure 1:
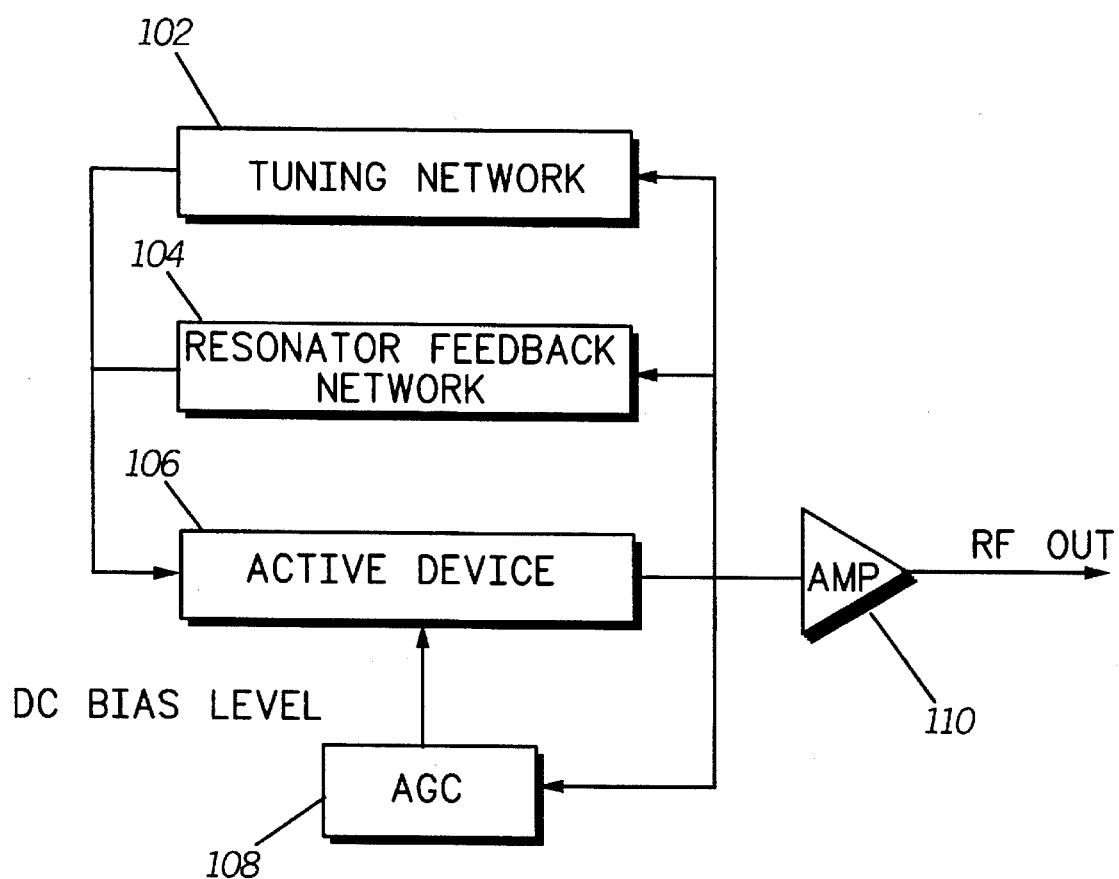
FIG. 1 shows a block diagram of an oscillator in accordance with the present invention.

Referring to FIG. 1, a block diagram of an oscillator 100 in accordance with the present invention is shown. The oscillator 100 includes a tuning network 102 and an active device 106. A feedback network 104 provides a positive feedback for the circuit which in turn would oscillate at a desired frequency. An automatic gain control (AGC) circuit provides a means of minimizing the degree to which the active device is in limiting, so as to reduce the nonlinear mixing effects that degrade noise performance. An amplifier 110 provides a buffer for the oscillator 100.

Figure 2:
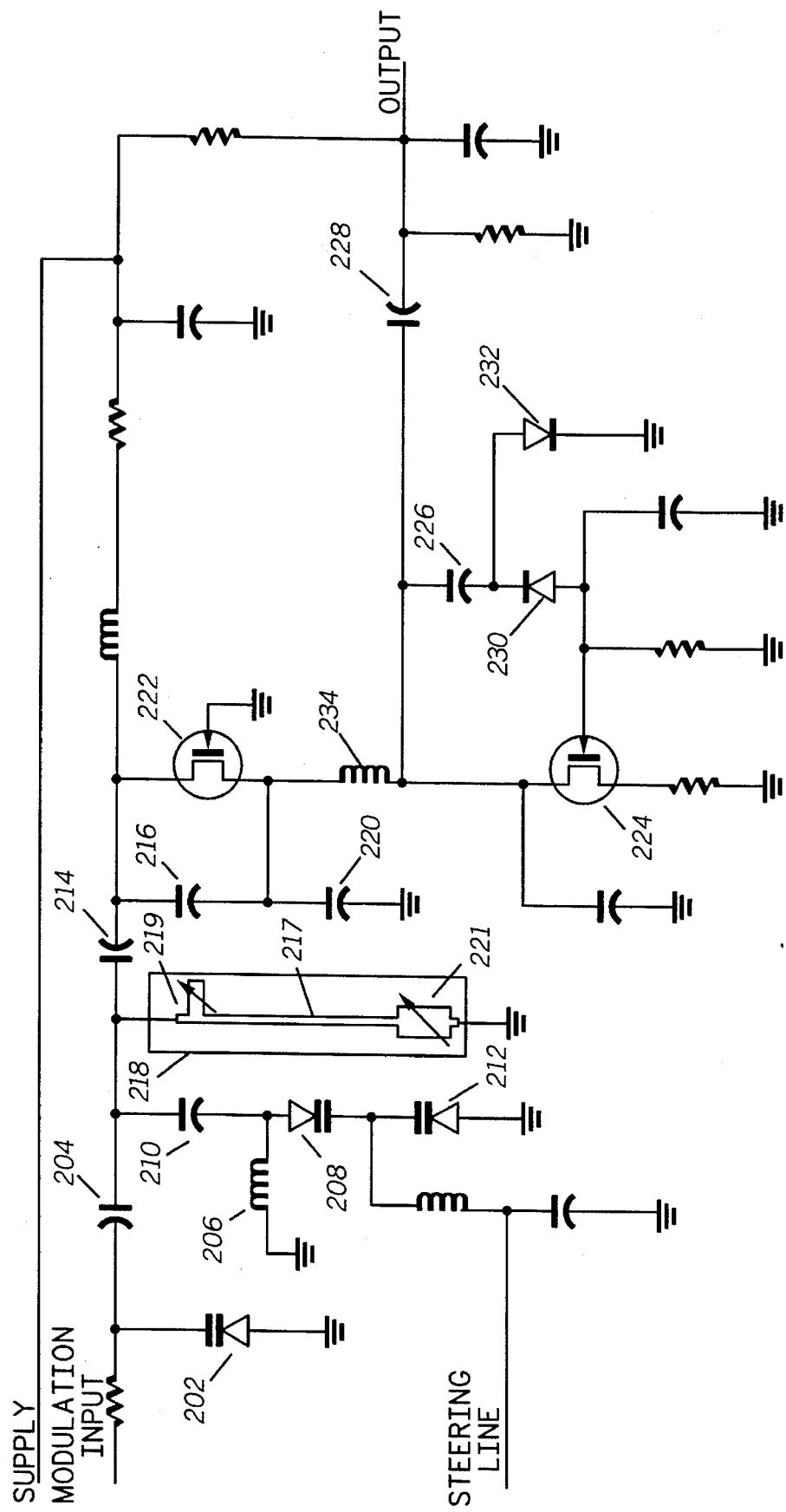
FIG. 2 shows a schematic diagram of a voltage controlled oscillator in accordance with the present invention.

Referring to FIG. 2 a schematic diagram of the oscillator 100 in accordance with the present invention is shown. To facilitate the understanding of the operation of the oscillator 100, only those components of the circuit 100 that are relevant to the present invention will be discussed. In the preferred embodiment, a Colpitts oscillator is used with transistor 224 operating as the amplifier of the AGC 108. Transistor 222 is the active device of the oscillator. A divider network comprising capacitors 216 and 220 determine the amount of feedback for the active device 106. The resonator feedback network 104 includes a resonator 218 which can be tuned in accordance with the present invention. The tuning circuit 102 which is in parallel with the resonator feedback network 104 includes tuning varactors 208 and 212. This tank circuit 102 is coupled to the active device 222 via a capacitor 214. The varactor 208 and 212 are coupled to the resonator 218 via a capacitor 210. An inductor 206 linearizes the tuning circuit 102 by increasing the effective capacitance swing for a given tuning range of varactors 208 and 212. A modulation varactor 202 allows for an input signal to modulate the signal generated by the oscillator 100. This varactor 202 is lightly coupled to the tank circuit 102 via a capacitor 204.

Transistor 224 function as the active component of the AGC 108. The coupling of the oscillator signal to the transistor 224 is provided by a capacitor 226 and rectifiers 230 and 232. The drain of the transistor 224 is coupled to the amplifier 222 via an inductor 234, hence completing the feedback. The output of the transistor 222 is coupled to the amplifier 110 via a capacitor 228.

The tuning block 218 includes a capacitive portion 219 and an inductive portion 221. These two components are coupled to each other via a micro-strip 217. The capacitive portion 219 is used to tune for higher frequencies while the inductive portion 221 tunes the operating frequency to a lower frequency. In the preferred embodiment, the tuning of the two capacitive and inductive stubs 219 and 221 is conducted via laser. The metalization on the capacitive stub 219 is removed via a computer guided laser according to procedures known in the art. The removal of metal from the capacitive portion 219 causes the operating frequency to increase. The VCO is tuned down to the desired level by making cuts in the inductive stub 221. The frequency of the oscillator 100 is tuned higher or lower to the operating frequency depending on the component variation and then tuned down to the desired level by making cuts in the inductive stub 221.

Figure 3:
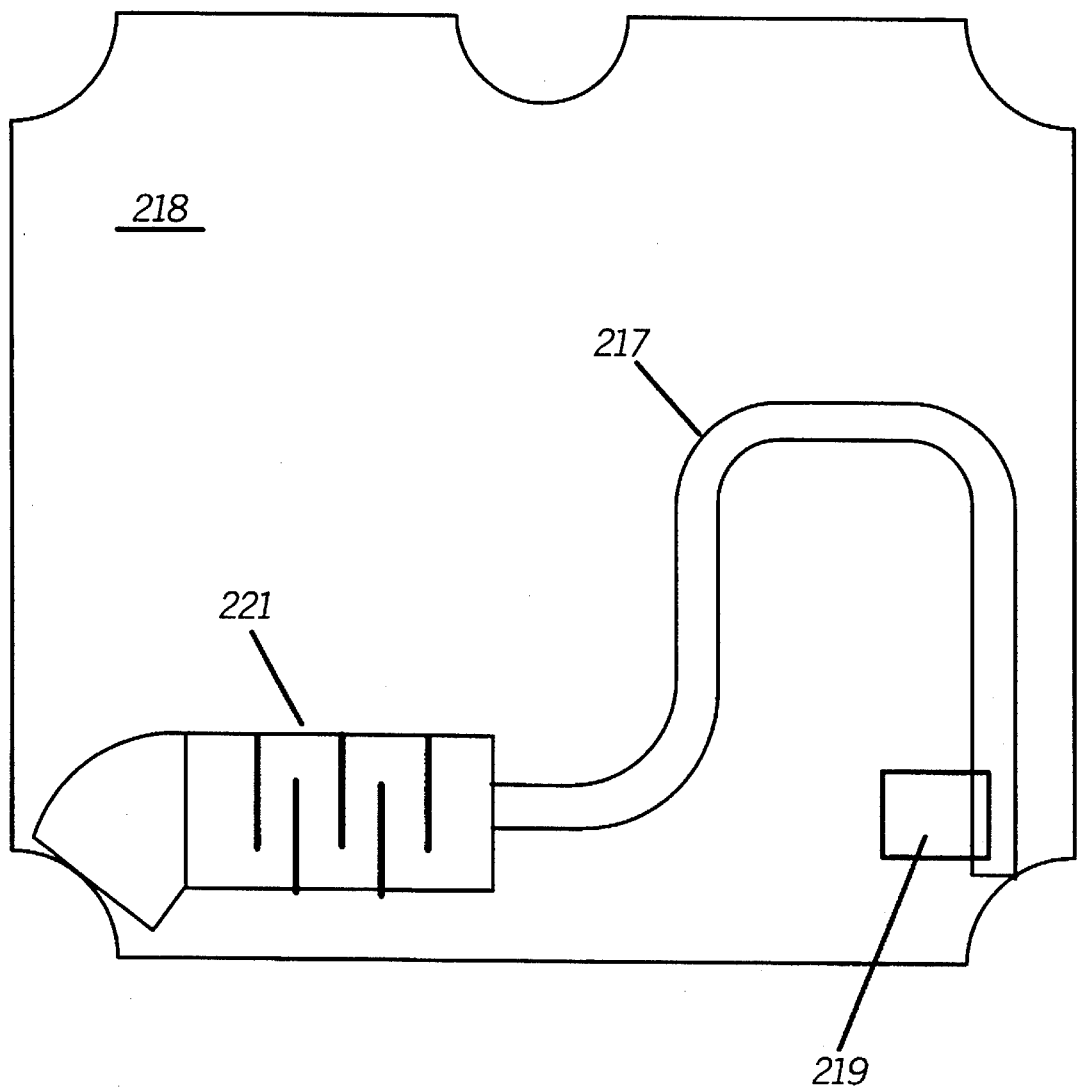
FIG. 3 shows a resonator in accordance with the present invention.

Referring to FIG. 3 the elements of the resonator 218 in accordance with the present invention are shown. The resonator 218 is formed on a substrate that may be used to accommodate other circuit components. The material used in the manufacture of the substrate could be any well known material such as Alumina, Saphire, Beryllium Oxide (BeO), Glass, or Quartz.

Disposed on the substrate is the resonator 218 having the inductive portion 221. Also disposed on the substrate is the capacitive portion, stub 219. A relatively thin runner forming the micro-strip 217 couples the metalized portion or pad 219 to the inductive pad 221. As can be seen the pad 221 is wider than the runner 217. In order to tune the oscillator 100, a plurality of cuts are made on the pad 221. This plurality of cuts are made in such a way to produce a continuous runner attached to the micro-strip 217 and having a width not smaller that the width of the runner 217 in order to minimize degradation in the Q of the resonator 218. These cuts increase the inductance of the inductive component 221 in order to decrease the resonator frequency.

A benefit of the present invention is that the oscillator 100 may be tuned in a large window right in the factory. A signal coupled to the substrate is routed through the runner 217 and coupled to the pad 221 which looks like a long runner after the cuts. The number of cuts are determined by the operating frequency of the oscillator 100. This operating frequency may be achieved via any of several number of cuts. However, the number of cuts is limited to maintaining the width of each of the runners that comprise the pad 221 no smaller than the width of the runner 217. This condition is mandated since it is desired to avoid constraining the current flow through the inductor 221 beyond the limitation forced thereon via the micro-strip 217. Additional limitation on the current flow increases the effective series resistance of the inductor which would in turn reduce its Q. Therefore, in order to minimize the degradation in the Q, the width of the runners formed via the cuts is forced to exceed that of the micro-strip 217.

Figure 4:
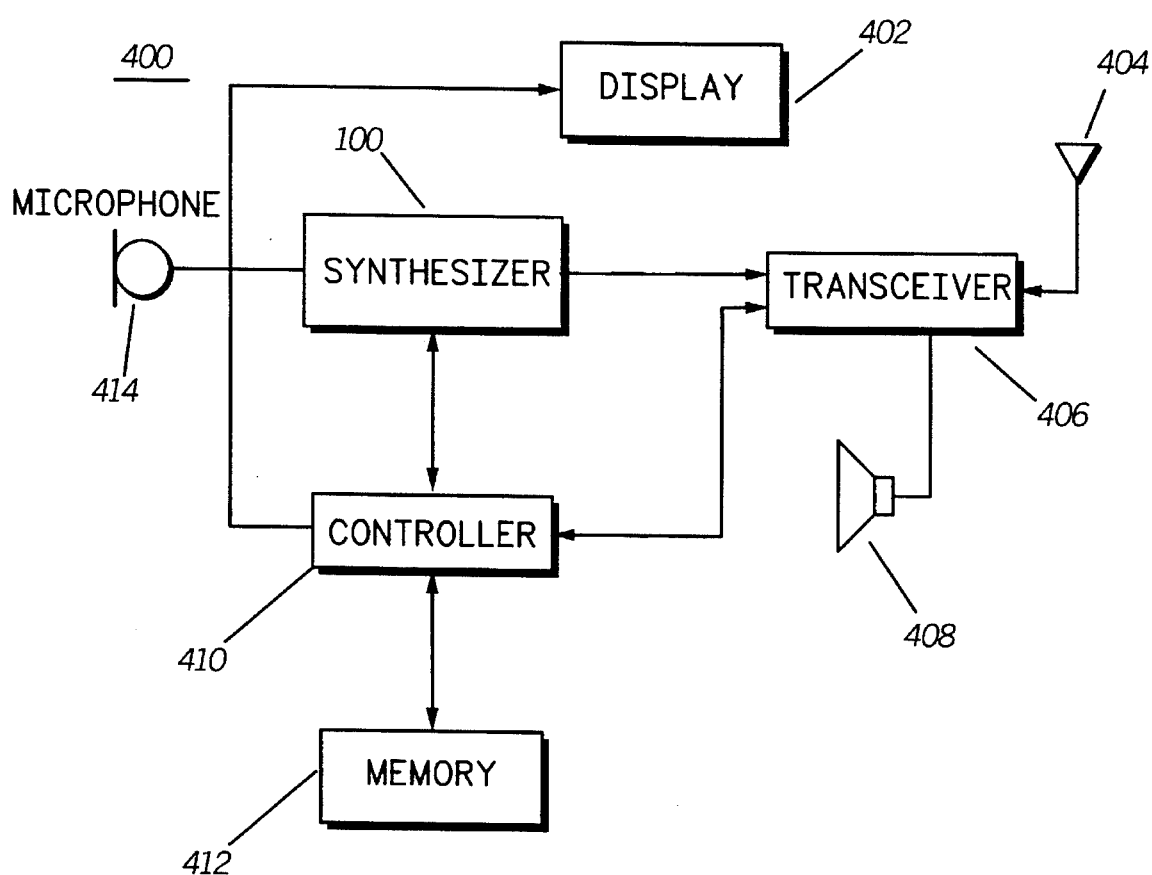
FIG. 4 shows a communication device in accordance with the present invention.

Referring now to FIG. 4, a block diagram of a communication device 400 is shown. The communication device 400 includes an antenna 404 which is used to transmit and receive radio frequency signals. The antenna 404 is coupled to a transceiver 406 which processes receive and transmit signals. The transceiver 406 includes circuitry to selectively switch between transmit and receive mode. Coupled to the transceiver 406 is a synthesizer 416 which includes the VCO 100. The output signal 114 provides the local reference oscillator signal for the transceiver 406. The operation of the transceiver 406 is controlled via a controller 410 which also controls the operation of the synthesizer 416.

Received signals are processed and demodulated by the elements of the transceiver 406. Voice components of the received signals are coupled to a speaker 408. Data components of the received signals after being analyzed and decoded by the controller 410 are displayed on a display 402. A microphone 414 provides the modulating signal to the synthesizer 416. This signal is coupled to the modulation input of the oscillator 100. The microphone 414 includes all the necessary circuitries to process audio signals before they are applied to the oscillator 100. In the transmit mode, a modulated signal which is available at the output of the oscillator 100 is coupled to the transceiver 406 where it is filtered, amplified, and coupled to the antenna 404 for transmission.

In summary, an inductor coupled to a capacitor via a micro-strip, functions as the reactive component of the tank circuit 104. The tank circuit 104 is tuned to a desired frequency via a number of cuts that are made on the inductive component 221. The number of cuts is controlled by the operating frequency of the oscillator 100 and the width of the runner 217 connecting the pad 221 to the capacitor 219. The benefit of a number of cuts, in the pattern shown, is to increase the laser tunable range for a given inductive pad size without degrading component Q.

It is noted that although the preferred embodiment shows a Colpitts configuration one could readily apply the principles of the present invention to any style of oscillators including Hartley configurations. It is further noted that although the principles of the present invention provide for a method of increasing the tunability of a resonator without degrading the Q, these two characteristics do not have to coexist. In alternative embodiments of the present invention a resonator may sacrifice degrading its Q for additional tunability. In such an embodiment, the width of the runner which is produced as the result of the cuts formed on the metalized portion may be narrower than that of the micro-strip. These additional cuts result in increased tunability at the expense of a lower Q.

What is claimed is:

1. An oscillator having an operating frequency, comprising:
   a resonator having a quality factor (Q) and disposed on a circuit carrying substrate, the resonator comprising:
      a micro-strip having a width and disposed on the substrate;
      an inductive component having a metalized portion disposed on the substrate;
      a plurality of cuts made on the metalized portion in order to tune the operating frequency of the oscillator, the plurality of cuts are made in such a way to produce a continuous runner having a width not smaller that the width of the micro-strip in order to minimize degradation in the Q of the resonator;
   an amplifier coupled to the resonator; and
   an output.

2. The oscillator of claim 1, wherein the micro-strip is printed on the substrate.

3. The oscillator of claim 1, wherein the inductive component is printed on the substrate.

4. The oscillator of claim 1, wherein the substrate includes an Alumina substrate.

5. The oscillator of claim 1, wherein the substrate includes a Sphire substrate.

6. The oscillator of claim 1, wherein the substrate includes a Beryllium Oxide substrate.

7. The oscillator of claim 1, wherein the substrate includes a glass substrate.

8. The oscillator of claim 1, wherein the substrate includes a Quartz substrate.

9. An oscillator having an operating frequency, comprising:
   a resonator having a quality factor (Q) and disposed on a circuit carrying substrate, the resonator comprising:
      a capacitive stub;
      an inductive portion having a width;
      a micro-strip disposed on the substrate for coupling the capacitive stub to the inductive portion;
      a plurality of cuts made on the inductive portion in order to tune the operating frequency of the oscillator, the plurality of cuts are made in such a way to produce a continuous runner having a width not smaller that the width of the inductive portion in order to minimize degradation in the Q of the resonator;

an amplifier coupled to the resonator; and an output.

10. A communication device, comprising: an oscillator for generating a local oscillator signal, the oscillator comprising:

a resonator disposed on a circuit carrying substrate, the resonator comprising:

a micro-strip having a width and disposed on the substrate;

an inductive component having a metalized portion disposed on the substrate;

a plurality of cuts on the metalized portion in order to tune the operating frequency of the oscillator, the plurality of cuts are made in such a way to produce a continuous runner having a width not smaller that the width of the micro-strip;

an amplifier coupled to the resonator; and an output.

11. The communication device of claim 10, wherein the oscillator includes a Colpitts oscillator.

12. The communication device of claim 10, wherein the oscillator includes a Hartley oscillator.

\* \* \* \* \*